United States Patent [19]
Lim et al.

[11] Patent Number: 5,454,738
[45] Date of Patent: Oct. 3, 1995

[54] ELECTRICAL CONNECTOR HAVING REDUCED CROSS-TALK

[75] Inventors: Gunsang Lim, Cordova; Richard D. Marowsky, Collierville, both of Tenn.; Ben Khoshnood, Parkland, Fla.

[73] Assignee: Thomas & Betts Corporation

[21] Appl. No.: 248,997

[22] Filed: May 25, 1994

Related U.S. Application Data

[63] Continuation of Ser. No. 132,015, Oct. 5, 1993.
[51] Int. Cl.$^6$ ................................. H01R 13/719
[52] U.S. Cl. ................................. 439/676
[58] Field of Search ................. 439/607–610, 439/676, 638, 620, 894; 333/1, 12; 379/332, 417

[56] References Cited

U.S. PATENT DOCUMENTS

| | | | |
|---|---|---|---|
| 2,667,543 | 1/1954 | Smith et al. | 174/33 |
| 3,757,028 | 9/1973 | Schlessel | 174/34 |
| 4,157,612 | 6/1979 | Rainal | 174/32 |
| 4,418,239 | 11/1983 | Larson | 174/34 |
| 4,428,632 | 1/1984 | Rich | 439/63 |
| 4,551,576 | 11/1985 | Rich | 174/36 |
| 4,657,330 | 4/1987 | Levy | 439/402 |
| 4,831,497 | 5/1989 | Webster et al. | 361/406 |
| 4,878,847 | 11/1989 | Rutledge | 439/74 |
| 5,186,647 | 2/1993 | Denkmann et al. | 439/395 |
| 5,226,835 | 7/1993 | Baker, III et al. | 439/403 |

FOREIGN PATENT DOCUMENTS

| | | |
|---|---|---|
| 0421174 | 4/1991 | European Pat. Off. . |
| 0524358 | 1/1993 | European Pat. Off. . |
| 0525703 | 2/1993 | European Pat. Off. . |
| 61-256850 | 11/1986 | Japan . |
| 2-91987 | 3/1990 | Japan . |
| 2-268484 | 11/1990 | Japan . |
| 2233157 | 1/1991 | United Kingdom . |
| 2269941 | 2/1994 | United Kingdom . |

OTHER PUBLICATIONS

IBM Technical Disclosure Bulletin, 5 pages, pp. 762–766, vol. 18, No. 3 Aug. 1975.
IBM Technical Disclosure Bulletin, 2 pages, pp. 155–156, vol. 16, No. 1 Jun. 1973.
IBM Technical Disclosure Bulletin, 3 pages, pp. 375–377, vol. 30, No. 8 Jan. 1988.
IBM Technical Disclousre Bulletin, 2 pages, pp. 354–355, vol. 33, No. 2 Jul. 1990.
Japan Abstract, JP5136650, Jan. 6, 1993, 1 page, vol. 17, No. 518.

*Primary Examiner*—Neil Abrams
*Attorney, Agent, or Firm*—Robert M. Rodrick

[57] ABSTRACT

An electrical connector having crosstalk reduction between selected pairs of electrical contacts comprises a printed circuit board having a pair of circuit elements therein connected to selected contacts in the connector. The signal paths of such selected contacts are re-routed by means of the pattern of circuit elements in the printed circuit board, each circuit element balancing the mutual inductance in such re-routed signal paths for enhanced crosstalk reduction.

15 Claims, 6 Drawing Sheets

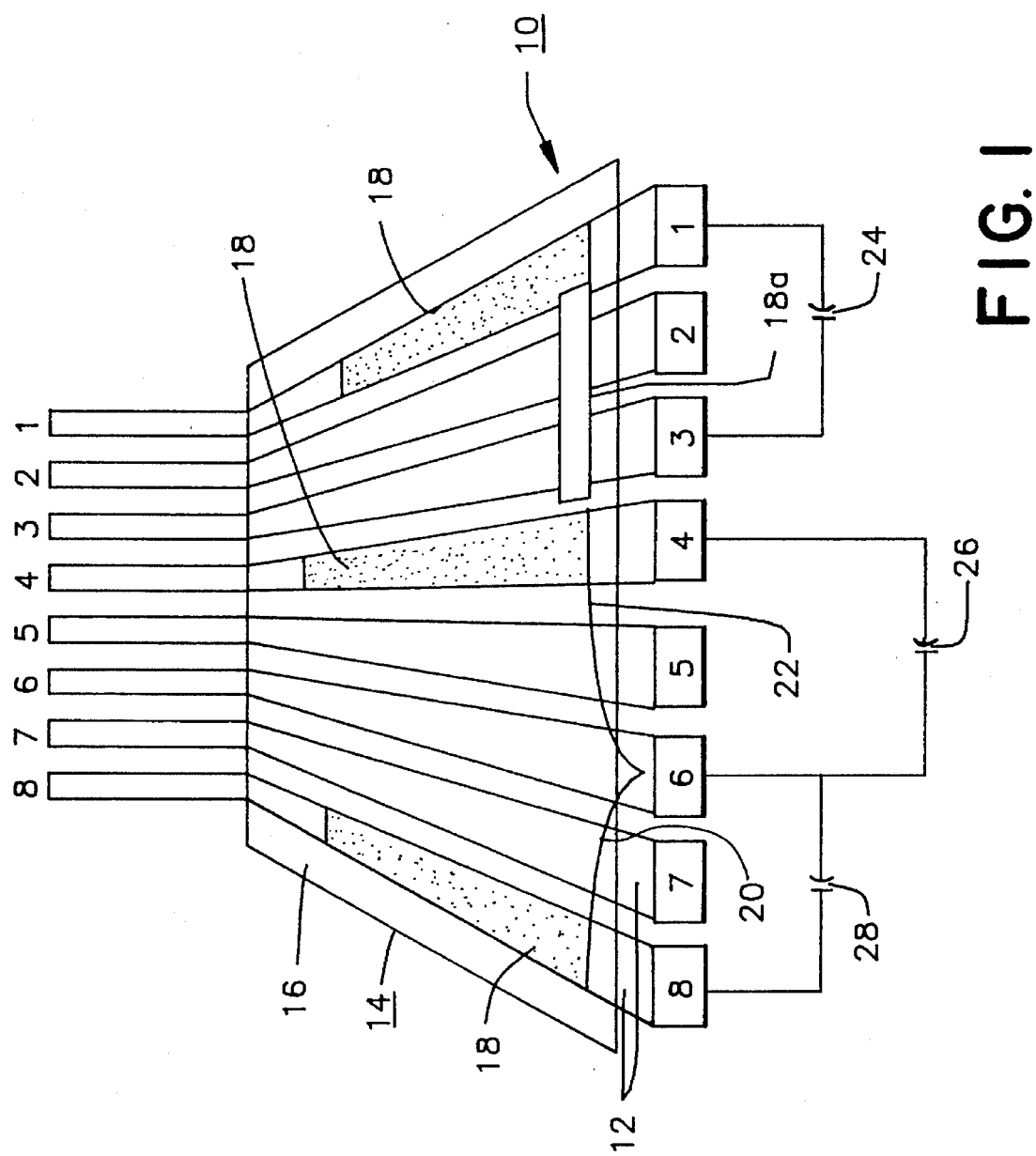
FIG. I

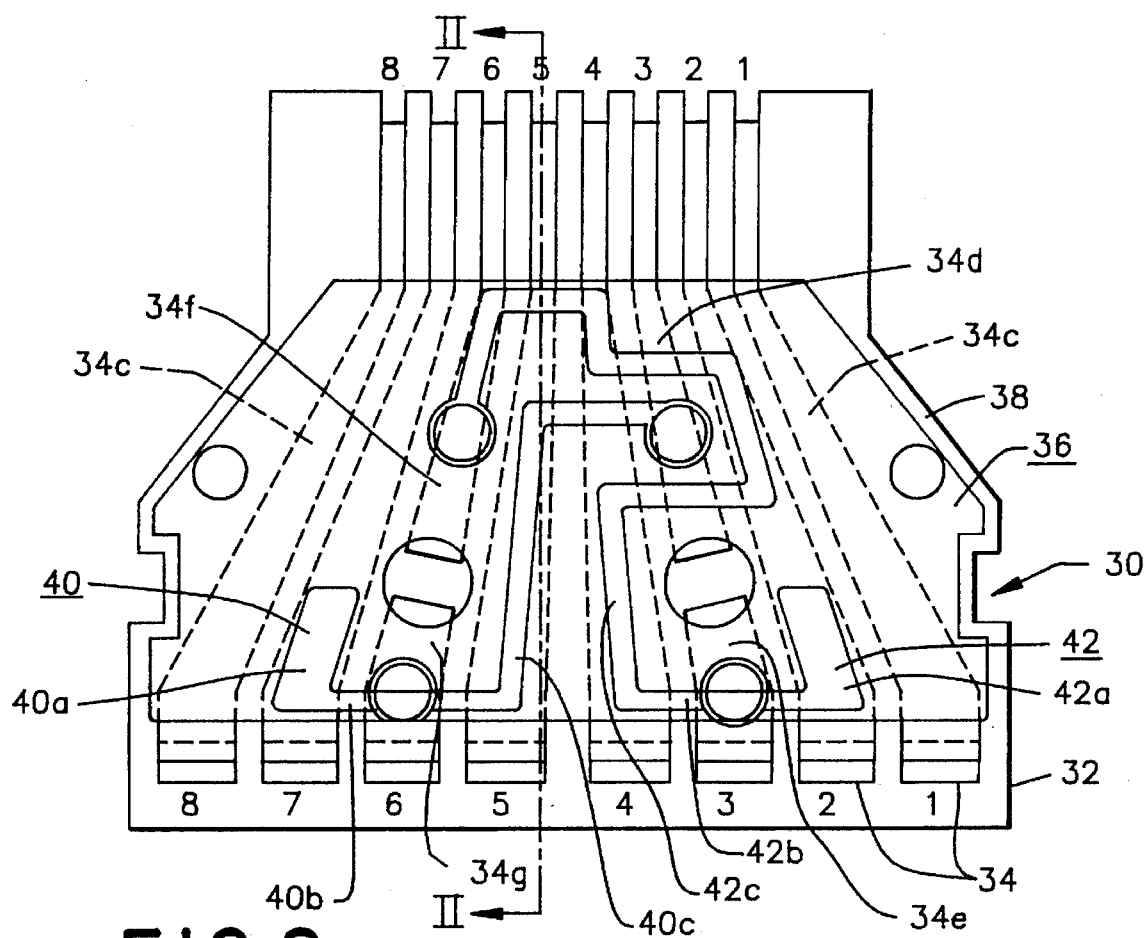

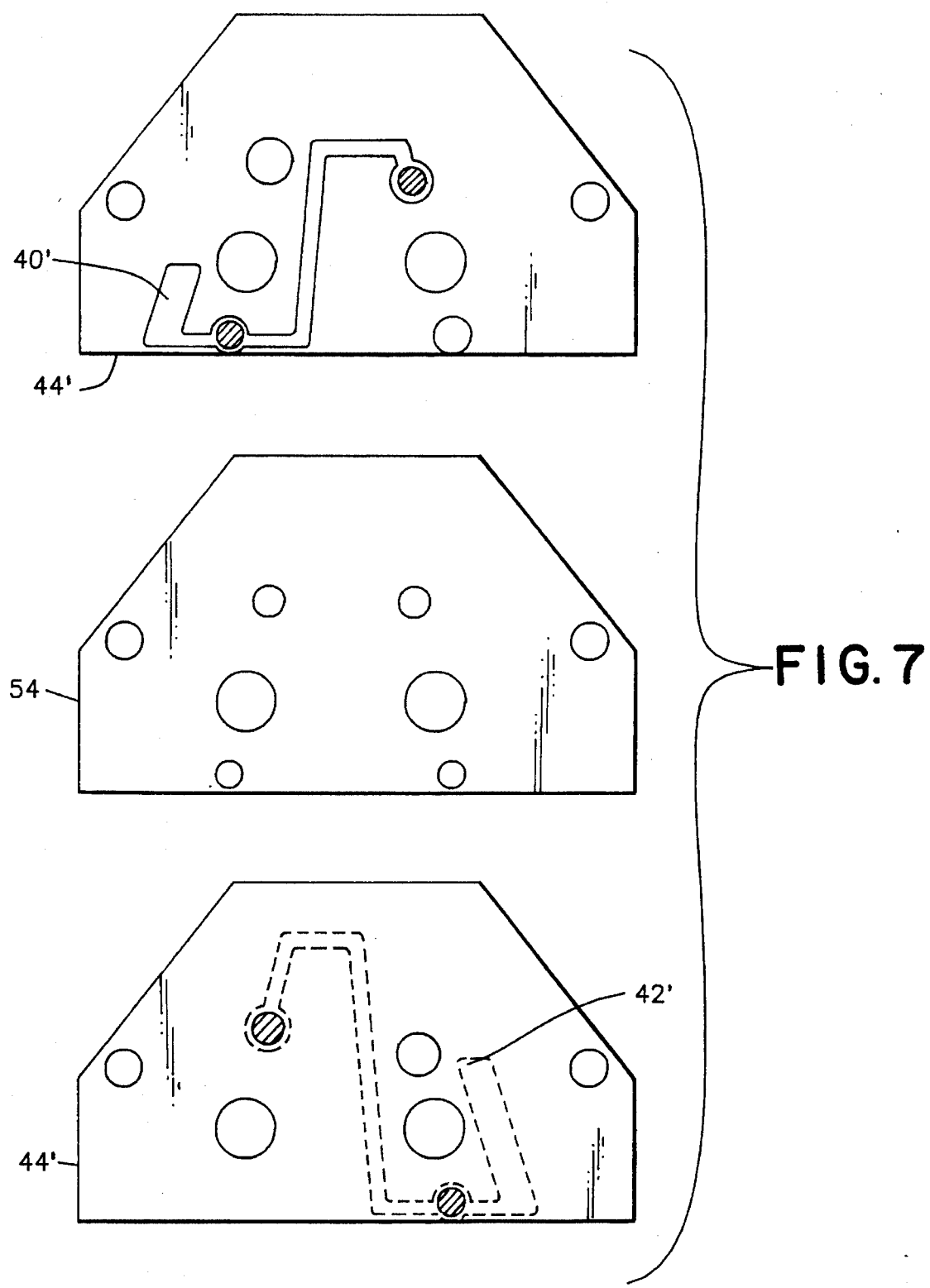

5,454,738

ELECTRICAL CONNECTOR HAVING REDUCED CROSS-TALK

This is a continuation of application Ser. No. 08/132,015, filed Oct. 5, 1993.

FIELD OF THE INVENTION

This invention relates generally to electrical connectors and, more specifically, to an electrical connector having reduced crosstalk interference.

BACKGROUND OF THE INVENTION

Efforts have recently been made to utilize conventional telephone RJ45 jack and plug connectors for data transmission having higher transmission frequencies than is required in voice transmission. The performance criteria for such jack and plug connectors is governed by the EIA/TIA standard TSB-40 (connecting hardware specification), Category 5. One aspect of the Category 5 level in the standard is a lower level of crosstalk coupling between adjacent contacts in the electrical connectors. By way of example, a standard OMNI RJ45 jack connector in commercial use by the assignee of the subject application meets Category 3 of the crosstalk requirements per the TSB-40 performance requirements.

It is known that crosstalk reduction or cancellation may be achieved in an electrical connector by adding capacitance between certain pairs of conductors or contacts within a standard OMNI jack. This is described, in particular in U.S. patent application, Ser. No. 08/011,020, entitled, "Apparatus and Method for Cross-Talk Reduction," filed on Jan. 29, 1993, and assigned to the same assignee as the subject application. As described and shown in such application, the particular technique for increasing the capacitance between selected connector contacts is to add discrete capacitors thereto. The application further recognizes that such increased capacitance may be obtained from distributed and/or stray capacitance which may be derived from appropriate disposition of traces on a printed circuit board which is used to connect selected pairs of contacts in the connectors described therein.

It is therefore desirable to not only achieve an electrical connector having the Category 5 crosstalk requirements, but also to decrease the cost of such connectors and improve the manufacturability thereof. It is further desirable to continue to utilize standard devices as much as possible, such as the use of a standard OMNI plug if a modified jack in connection therewith satisfactorily meets the Category 5 performance level.

SUMMARY OF THE INVENTION

It is accordingly an object of the subject invention to provide an electrical connector which achieves reduced crosstalk coupling between selected pairs of electrical contacts.

In accordance with a preferred form of the invention, an electrical connector comprises an insulative housing, a plurality of electrical contacts being supported on the housing. The contacts are disposed in a side-by-side arrangement with a spacing between each pair of contacts. A dielectric substrate overlies the contacts, a conductive trace being supported by the dielectric substrate. The conductive trace is disposed to be in spatial registry with one of the contacts in the connector. The conductive trace is of configuration to define with the dielectric constant and permeability of the dielectric substrate a predetermined mutual inductance and capacitance. A conductive element is provided which connects the conductive trace to another one of the contacts in the electrical connector.

BRIEF DESCRIPTION OF THE DRAWINGS

FIG. 1 is a schematic illustration of one form of the invention for use in reducing crosstalk of a multi-contact connector.

FIG. 2 is a top plan view of an OMNI jack connector comprising a printed circuit board particularly adapted to provide crosstalk reduction between selected pairs of contacts in the connector.

FIG. 3 is a front elevation view of the connector of FIG. 2.

FIG. 4 is a cross-sectional view of the connector of FIG. 2 as seen along viewing lines II—II.

FIG. 7 is an exploded view of the components of the alternate printed circuit board of FIG. 6.

DETAILED DESCRIPTION OF THE PREFERRED EMBODIMENTS

Figure 5:
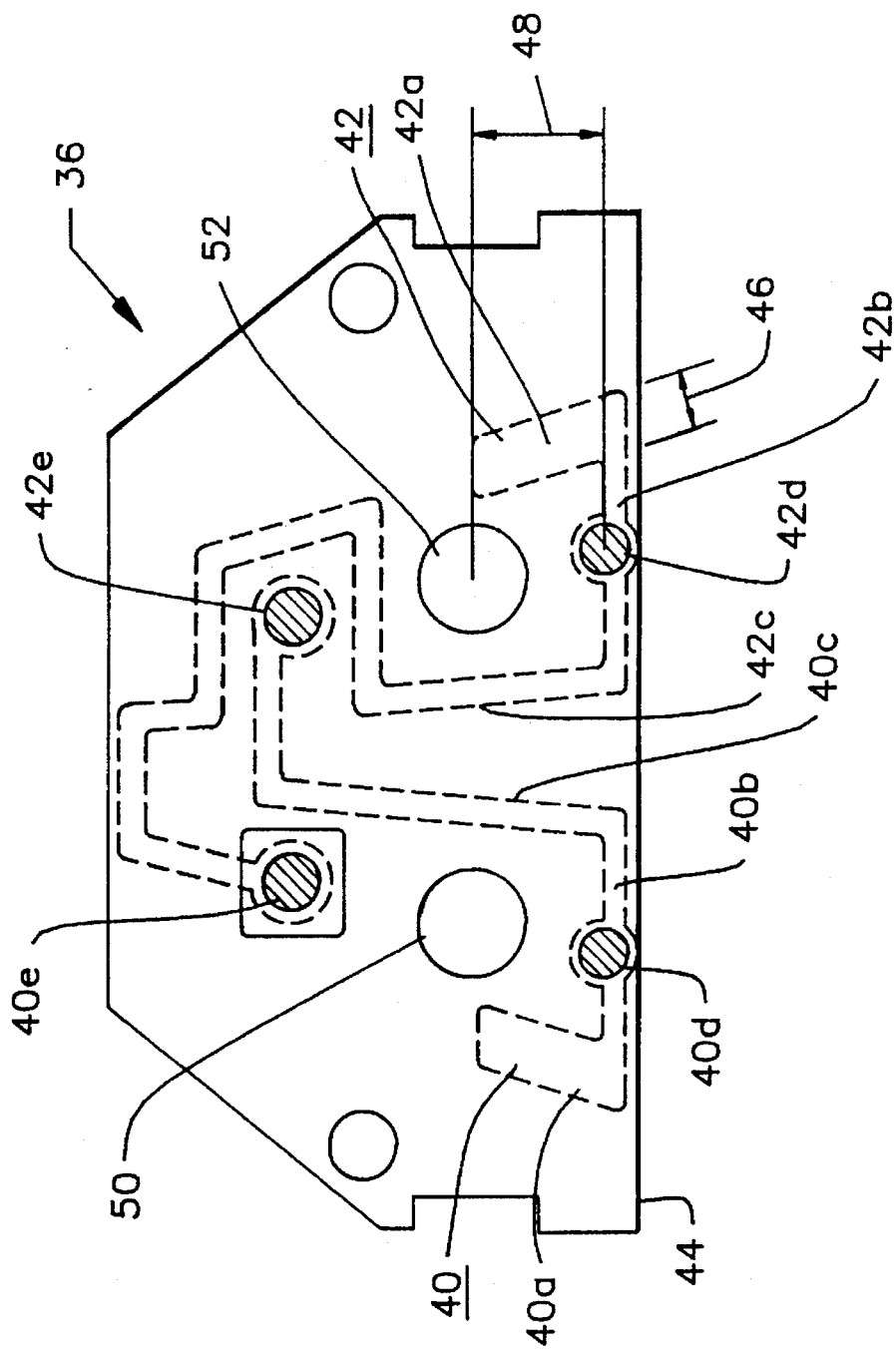
FIG. 5 is a top plan view of the circuit board used in conjunction with the connector of FIG. 2.

Turning now to FIG. 1, there is schematically shown one form of the invention for use in increasing the capacitance in a multi-contact electrical connector. Schematically, in the illustration shown, the electrical connector 10 comprises eight contacts 12 arranged in side-by-side disposition. Each of the contacts in the preferred configuration has a generally rectangular cross-section and a substantially flat upper surface, the upper surfaces of each of the contacts 12 generally lying in a common plane. The contacts 12 are configured to represent a standard OMNI RJ45 jack connector.

Overlying the contacts 12 is a printed circuit board 14 comprising a dielectric substrate 16, such as MICA. Traces 18 of conductive material, such as copper, are supported on the substrate 16 in spatial registry with selected connector contacts 12, such as contact No. 1, No. 4 and No. 8, as shown. The disposition of the traces 18 over the contacts 12 with dielectric material and its permeability therebetween creates a capacitive relationship between the conductive traces and the contacts that may be considered parallel plates, and effects the inductance and conductance as well. In principle, capacitance between parallel plates is basically a function of (1) the area A of the plates, (2) the distance D between the plates, and (3) the dielectric constant K of the dielectric material between the plates. Such capacitance, in picofareds (pF), may be calculated using the equation:

$$C = (.2249 A/D) K$$

The conductive traces 18 may be connected to another connector contact 12 to increase the capacitance between contact pairs. For example, a connecting element, such as a wire 20, may be used to connect the conductive trace 18 over contact 8 to contact 6 and another wire 22 may be used to connect the conductive trace 18 over contact 4 to contact 6. Alternatively, a portion 18a may be formed from the conductive trace 18, such connecting trace 18a being connected, for example, to contact 3. So connected, the capacitance 24 may be increased between pair 1–3, the capacitance 26 may be increased between pair 4–6 and the capacitance 28 may be increased between pair 6–8. In one example, the MICA substrate may be selected to be approximately 0.002 inch thick and the copper conductive traces selected to be 0.002 inch thick.

Referring now to FIGS. 2–4, it can be seen how the principles of the invention described with reference to FIG. 1 are implemented to provide crosstalk reduction in practice. In these Figures, an electrical connector of the type known as an OMNI RJ45 Jack connector, modified in accordance with the aspects of the subject invention, is shown. In the embodiment shown there are eight contacts defining four pairs of contacts in accordance with industry usage.

The connector 30 comprises an insulative housing 32 supporting a plurality of electrical contacts 34 thereon in side-by-side arrangement. Each contact 34 includes a forward terminal portion 34a formed in cantilevered fashion to make electrical connection to complementary contacts in an OMNI plug connector (not shown). Each contact 34 further includes a rearward terminal, preferably in the form of an insulation displacement contact (IDC) for electrical connection with conductors of insulated wire. Between each forward terminal 34a and rearward terminal 34b, each contact includes a transition portion 34c having a generally rectangular cross-section and having a substantially flat surface area between the forward and rearward terminals. The flat transition portions, which are formed to make a pitch transition between the pitch of the IDC rearward terminals 34b and the cantilevered forward terminals 34a are supported on the connector housing 32 in laterally spaced disposition and such that the flat surfaces of the transition portions 34c lie substantially in a common plane.

In accordance with the invention, the signal path of two of the contacts in the connector 30 are re-routed for purposes as will be described hereinbelow to assist in the crosstalk reduction features of the connector. Thus, at the rear portion of the connector, the signal path of contact 3 is placed between contacts 5 and 7, while the signal path 6 is placed between contacts 2 and 4, as illustrated in Figure 2. It can be seen in FIG. 2 that the forward terminal portions 34a are maintained in the proper sequential order of contacts from 1–8.

To accomplish the signal path re-routing, contacts 3 and 6 are severed, defining for contact 3 a forward portion 34d and a discontinuous rearward portion 34e. Similarly, for contact 6, a forward portion 34f is defined discontinuous from a rearward portion 34g.

A printed circuit board (PCB) 36 comprising insulated circuitry is attached to the electrical connector 30, preferably at the bottom thereof. The PCB 36 includes a dielectric substrate 38 supporting thereon a pair of circuit elements 40 and 42. Circuit element 40 includes a conductive trace 40a, a connecting trace 40b and a re-routing trace 40c. Conductive trace 40a lies in spatial registry over contact 7 and forms a capacitive relationship therewith. Connecting trace 40b extends transversely from conductive trace 40a to re-routing trace 40c and bridges the rearward portion 34g of severed contact 6 where it is suitably connected therewith. Re-routing portion 40c has an extent lying in spatial registry with contact 5 over a given length and bridges over contact 4 to contact 3 where it is connected to the forward portion 34d thereof.

Circuit element 42 comprises a conductive trace 42a, a connecting trace 42b and a re-routing trace 42c. Conductive trace 42a lies in spatial registry with contact 2 and defines a capacitive relationship therewith. Connecting trace 42b extends from conductive trace 42a to re-routing trace 42c, transversely therewith, and bridges the rearward portion 34e of contact 3 to which it is connected. Re-routing trace 42c includes an extent lying for a given length in spatial registry with contact 4 and is configured to bridge contact 5 and be connected to the forward portion 34f of contact 6. Circuit elements 40 and 42 thereby re-route the signal paths of contacts 3 and 6 and, as will be indicated hereinbelow, add capacitance to such re-routed signal paths.

Turning now to FIG. 5, the details of the printed circuit board 36 are more fully described. In the arrangement shown, circuit elements 40 and 42 are configured in a manner such that there are no cross-over points between the conductive traces defining each circuit element. As such, the PCB 36 is formed of a pair of layers of dielectric films 44 sandwiching therebetween the circuit elements 40 and 42. In the preferred construction, each conductive film is made of a polyimide material 0.001 inch thick, such material being commercially available under the tradename KAPTON. The circuit elements are preferably defined by conductive traces of copper each having a thickness of approximately 0.004 inch. The circuit width of the connecting traces 40b and 42b as well as the re-routing portions 40c and 42c all typically have a dimension of about 0.018 inches. The connecting traces 40b and 42b at the position where such connecting traces are connected to the respective contacts 6 and 3, each have an enlarged welding pad 40d and 42d. Similarly, at the terminus of each of the re-routing traces 40c and 42c where such traces are respectively connected to the contacts 6 an 3, there are similarly formed enlarged welding pads 40e and 42e. A portion of the dielectric film 44 in alignment with each of the welding pads 40d, 40e and 42d, 42e is removed at both the top and bottom surfaces of the PCB 36 in order to expose such welding pads to allow welding thereof to the respective severed portions of contacts 3 and 6.

Referring still to FIG. 5, conductive traces 40a and 42a are configured to have a length and width to provide with the contacts 7 and 2, respectively, a predetermined capacitance. For example, each conductive trace 40a and 42a may be formed to have a width 46 approximately 0.050 inch and a length of approximately 0.100 inch will provide a capacitance on the order of about 2pF between contact 7 and trace 40. It is understood, however, that other dimensions, depending upon the desired capacitance, may be chosen.

Through holes 50 and 52 which extend completely through the dielectric film 44 are disposed in a manner such that when the PCB is attached to the connector 30, such holes 50, 52 lie in alignment with the severed portions of contacts 6 and 3.

Figure 6:
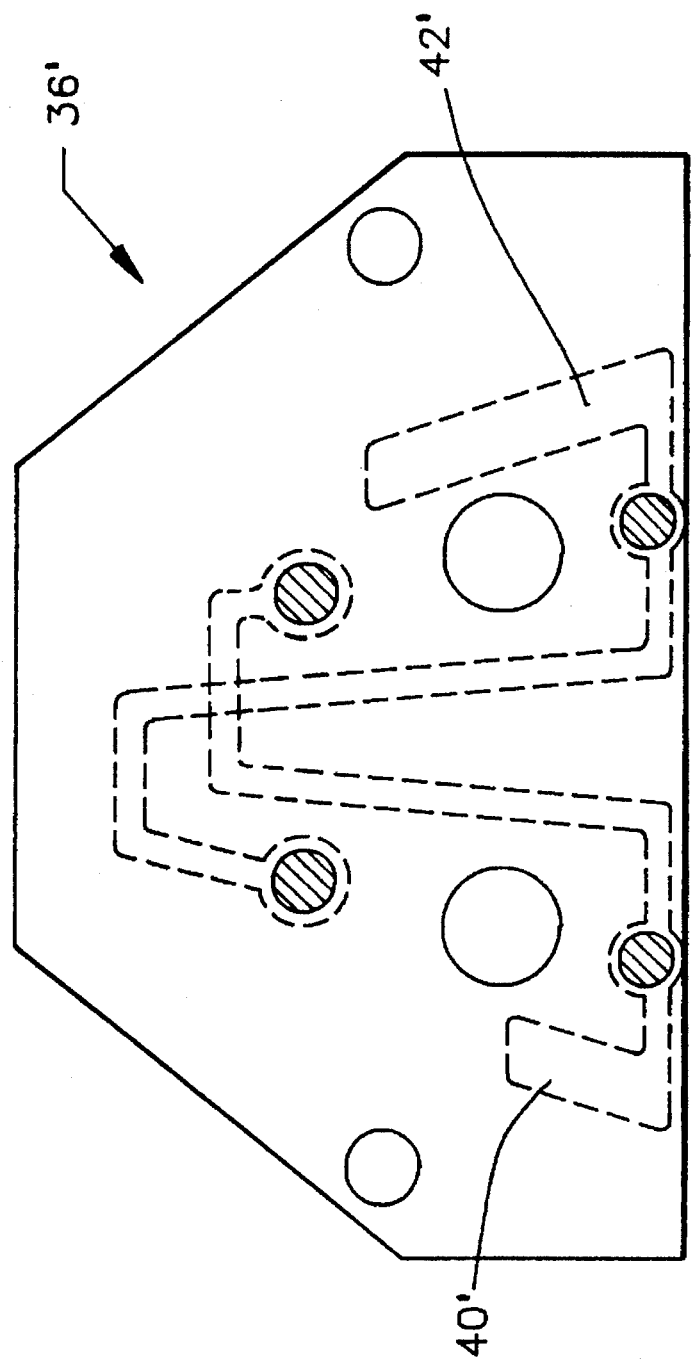
FIG. 6 is an alternate embodiment of a printed circuit board for use in conjunction with the connector of FIG. 2.

Referring now to FIG. 6 and 7, an alternate construction of the printed circuit board 36' is described. In this arrangement, the circuit elements 40' and 42' are configured in a manner such that there is a mutual overlapping of portions of the conductive traces. In order to construct such a printed circuit board 36', circuit element 40' is formed on a first dielectric film 44' while the other circuit element 42' is formed on a second dielectric film 44'. Prior to sandwiching the circuit elements 40' and 42' together to form the assembled PCB 36', a middle layer 54 of suitable insulation, such as a KAPTON film on the order of 0.001 inch thick must be inserted to insulate the respective circuit elements. Thus, the construction of a PCB 36' wherein the circuit pattern is arranged to mutually cross-over, is somewhat thicker and slightly more expensive to manufacture than the PCB 36 of FIG. 5, wherein both circuit elements 40 and 42 may be formed on one film which may then be covered with a second film.

Figure 8A:
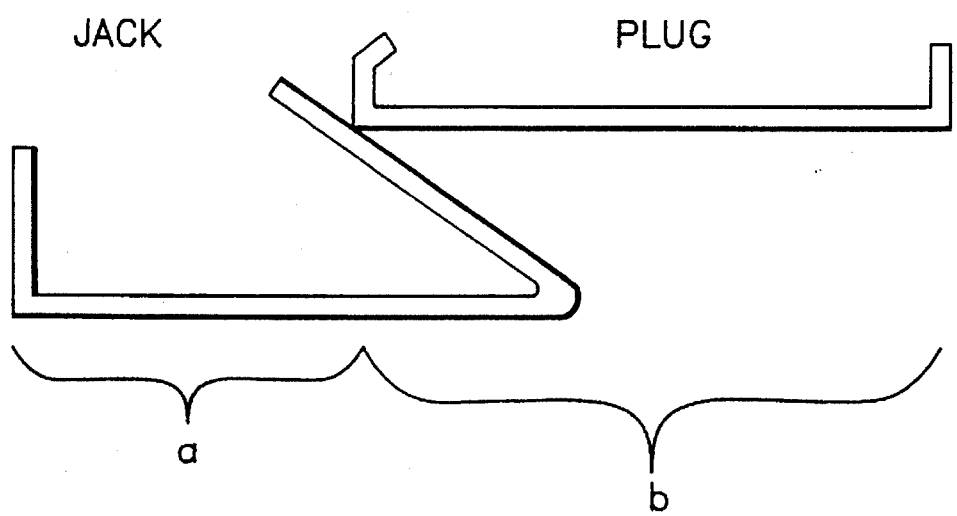
FIGS. 8a and 8b are schematic illustrations of contacts of the improved OMNI jack of the subject invention shown in connection with a standard OMNI plug.
Figure 8B:
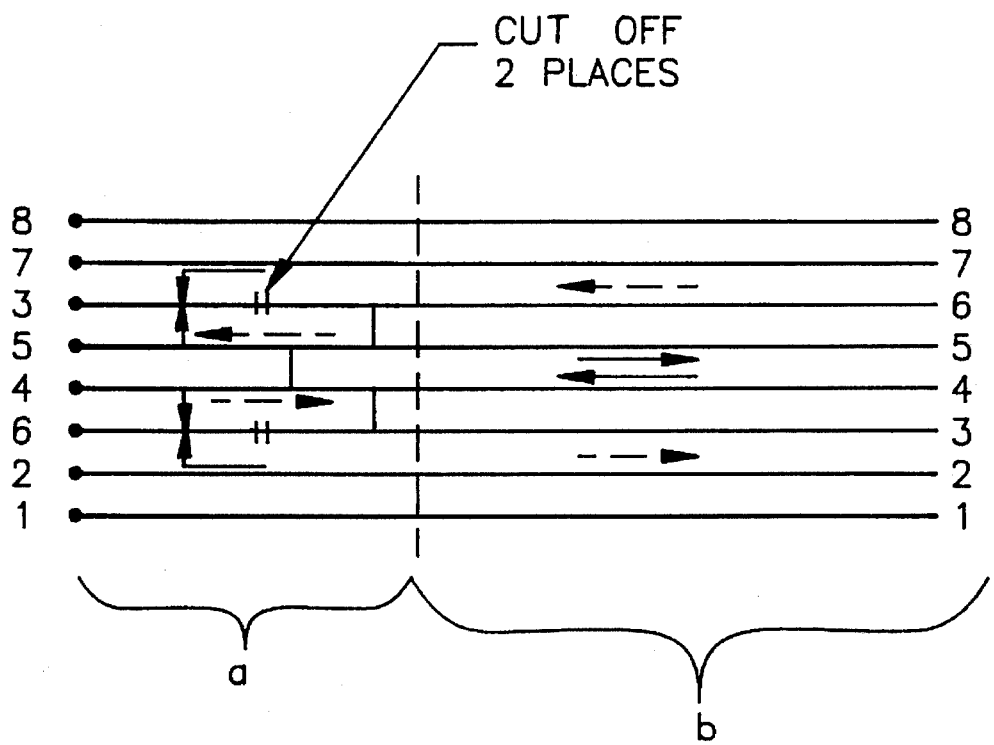

Referring now to FIG. 8, there is a schematic representation of the contacts of the modified OMNI jack as constructed herein and an OMNI plug which is of standard conventional construction. The OMNI jack and OMNI plug typically make a relatively long and close parallel multi-conductor circuit. Particularly, pair 1 (contacts 4 and 5) and pair 3 (contacts 3 and 6) typically define the worst condition for crosstalk problems.

To reduce the crosstalk, the area "a" defined by the wide conductor area of the OMNI jack is modified in a manner as described herein by the addition of a PCB 36 having the insulative circuitry thereon. The two circuit elements as indicated hereinabove are suitably welded to the severed contacts 3 and 6. The conductive trace 40a of the first circuit element 40 has a capacitive relationship to contact 7. Similarly, the conductive trace 42a of the second circuit element 42 has a capacitive relationship to conductor 2. Welding of the circuit elements 40 and 42 to the severed contacts 3 and 6, not only re-routes the signal paths thereof, but adds to such signal paths, the capacitances produced by the conductive traces 40a and 42a.

Further, the circuit "b" of the OMNI plug is much longer than the circuit "a" of the OMNI jack and the electromagnetic force (EMF) is thereby larger. To counter this effect, the signal paths in area "a", as described hereinabove of contacts 3 and 6, were re-routed by the circuit elements 40 and 42 on PCB 36. Since in area contacts 3 and 5 are quite close, and contacts 4 and 6 are similarly quite close, the induced EMF per unit length is much higher than the counterpart EMF in area "b". Thus, in the shorter paths in area "a" it is believed that a sufficient amount of induced EMF is generated to counter the induced EMF of area "b". In current commercial OMNI connectors without the subject improvement therein, the crosstalk between pair 1 and pair 3 typically measure between 26.4 dB to 26.7 dB at 100 MHz. Pair 1 is defined by contacts 4 and 5 while pair 3 is defined by contacts 3 and 6. Crosstalk between pair 1 and pair 3 is normally very high and the dominant factor is mutual inductance. By providing the two circuit elements 40 and 42, the mutual inductance is balanced and crosstalk reduction is achieved between pair 1 and pair 3. An OMNI connector modified in accordance with the re-routed signal paths and selected capacitance was found to have a measured crosstalk in one direction of approximately 43.0 dB and 42.2 dB in the reverse direction, at 100 MHz. Thus, while and OMNI jack connector may be modified as set forth herein to provide desired crosstalk reduction, a standard, non-modified OMNI plug connector may be used for connection therewith.

Having described herein the preferred embodiments of the subject invention, it should be appreciated that variations may be made thereof without departing from the contemplated scope of the invention. Accordingly, the preferred embodiments described herein are intended to be illustrative rather than limiting. The true scope of the invention is set forth in the claims appended hereto.

We claim:

1. An electrical connector comprising:

an insulative housing;

a plurality of elongate electrical contacts supported on said housing, said contacts being disposed in a mutually spaced side-by-side arrangement;

a dielectric substrate overlying said contacts;

a conductive trace having an extent supported by said dielectric substrate, said trace being disposed in spatial registry with a longitudinal portion of one of said contacts and being of configuration to define with said one contact and the permeability and the dielectric constant of said dielectric substrate a predetermined mutual inductance and capacitance.

2. An electrical connector according to claim 1, wherein said conductive trace comprises a conductive trace portion connected to said conductive trace extent.

3. An electrical connector according to claim 1, wherein there is another conductive trace on said dielectric substrate, having a portion disposed in spatial registry with another contact of said connector.

4. An electric connector according to claim 3, wherein said contacts are of generally rectangular cross-sections each having a substantially flat surface over which said conductive traces overlie.

5. An electrical connector according to claim 2, wherein said conductive trace extent lies transversely relative to said conductive trace portion.

6. An electrical connector according to claim 5, wherein said conductive trace comprises a further extent connected to said conductive trace portion, said further extent being disposed in spatial registry with a length of another of said elongate contacts.

7. An electrical connector comprising;

an insulative housing;

a plurality of elongate electrical contacts supported on said housing, said contacts being disposed in a mutually spaced side-by-side arrangement;

circuitry on said housing, including a dielectric substrate overlying said contacts and a pair of circuit elements disposed on said substrate, each of said circuit elements including a conductive trace having a predetermined length lying in spatial registry with a selective longitudinal portion of said contacts and being of configuration to define with said contacts and the permeability and the dielectric constant of said dielectric substrate a predetermined mutual inductance and capacitance.

8. An electrical connector according to claim 7, wherein said contacts are of generally rectangular cross-sections each having a substantially flat surface over which said conductive traces overlie.

9. An electrical connector according to claim 7, wherein said dielectric substrate comprises a pair of dielectric films sandwiching said pair of circuit elements.

10. An electrical connector according to claim 9, wherein said dielectric substrate further comprises a middle layer of insulation disposed between and insulating said pair of circuit elements.

11. An electrical connector according to claim 9, wherein one of said dielectric films is disposed on said contacts between said contacts and said pair of circuit elements and the other dielectric film is disposed on said pair of circuit elements.

12. An electrical connector according to claim 11, wherein said pair of films and said pair of circuit elements define a subassembly separate from said insulative housing.

13. An electrical connector comprising:

an insulative housing;

a plurality of electrical elongate contacts supported on said housing, said contacts being disposed in a mutually spaced side-by-side arrangement;

a dielectric substrate overlying said contacts;

a conductive trace on said dielectric substrate;

a dielectric film overlying said conductive trace;

said trace being disposed in spatial registry with one of said contacts and being of configuration to define with said one contact and the permeability and the dielectric constant of said dielectric substrate a predetermined mutual inductance and capacitance.

14. An electrical connector according to claim 13, wherein said dielectric substrate and said dielectric film sandwich said conductive trace.

15. An electrical connector according to claim 14, wherein said dielectric substrate, said conductive trace and said dielectric film define a subassembly separate from said insulative housing.

* * * * *